(12) United States Patent
Azenkot et al.

(10) Patent No.: US 9,065,610 B2
(45) Date of Patent: Jun. 23, 2015

(54) METHOD AND APPARATUS FOR SMOOTHING JITTER GENERATED BY BYTE STUFFING

(71) Applicant: Applied Micro Circuits Corporation, Sunnyvale, CA (US)

(72) Inventors: Yehuda Azenkot, San Jose, CA (US); Timothy P. Walker, Boxford, MA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 40 days.

(21) Appl. No.: 13/865,843

(22) Filed: Apr. 18, 2013

(65) Prior Publication Data

US 2014/0314192 A1    Oct. 23, 2014

(51) Int. Cl.
| | |
|---|---|
| H03D 3/24 | (2006.01) |
| H04L 25/49 | (2006.01) |
| H04L 1/00 | (2006.01) |
| H03L 7/081 | (2006.01) |
| H04J 3/07 | (2006.01) |

(52) U.S. Cl.
CPC ............... *H04L 1/004* (2013.01); *H03L 7/081* (2013.01); *H04J 3/076* (2013.01)

(58) Field of Classification Search
CPC .............................. H04L 7/033; H04L 7/0891
USPC ....... 375/376, 294, 375; 331/177 R; 327/156; 455/103, 127, 307, 325
See application file for complete search history.

(56) References Cited

U.S. PATENT DOCUMENTS

| | | | |
|---|---|---|---|
| 7,398,062 B2 * | 7/2008 | Mocquard et al. | 455/92 |
| 2008/0253493 A1 * | 10/2008 | Aoyama | 375/376 |

* cited by examiner

*Primary Examiner* — Khai Tran

(57) ABSTRACT

Systems and methods for smoothing jitter generated by byte stuffing. A frequency synthesizer comprises a smoothing logic coupled with a PLL. The smoothing logic is configured to modify a phase error signal generated by a phase frequency detector into a distributed phase error signal that spread over multiple clock cycles. The distributed phase error signal is used to drive a DCO. The smoothing logic may comprise a ramping logic operable to generate a series of ramping values to substitute a phase difference in the phase error signal. The phase difference may correspond to a stuffing byte.

17 Claims, 9 Drawing Sheets

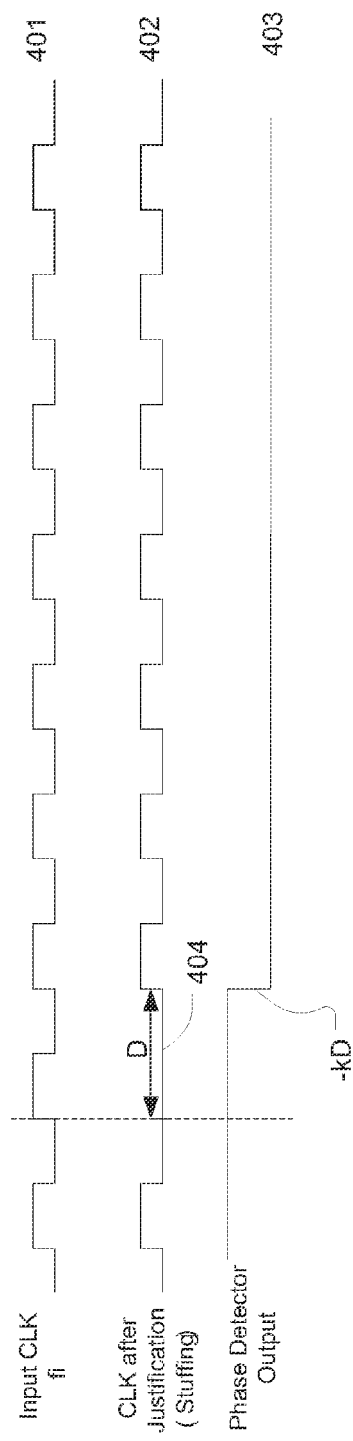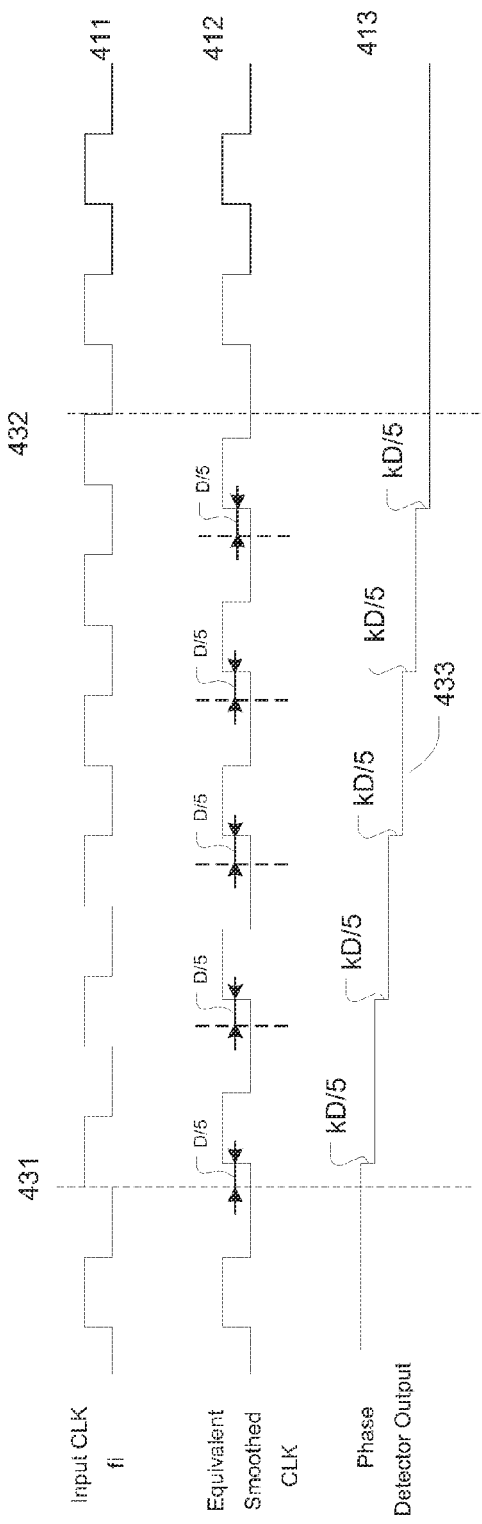
Fig. 4A
Fig. 4B

METHOD AND APPARATUS FOR SMOOTHING JITTER GENERATED BY BYTE STUFFING

CROSS REFERENCES

The present disclosure is related to: the co-pending patent application titled "METHOD AND APPARATUS FOR GAPPING," filed on Mar. 18, 2013 and Ser. No. 13/846,171; and the co-pending patent application titled "FREQUENCY SYNTHESIS WITH GAPPER," filed on Mar. 18, 2013 and Ser. No. 13/846, 311. The foregoing related patent applications are herein incorporated by reference.

TECHNICAL FIELD

The present disclosure relates generally to the field of electronics, and more specifically, to the field of frequency synthesis.

BACKGROUND

Gapped signals are widely used in Optical Transport Network (OTN), broadcast video as well as many other application areas. One of the key requirements of an OTN is to insert plesiochronous payloads into an OTN wrapper. That is, because the data transmission rate and the rate of the payload source may not be exactly the same, they may drift with respect to one another. One approach to solve the issue to is to generate a reference clock with missing clock edges (or gaps) to keep the incoming and outgoing data rates synchronized.

A gapped signal by its nature carries significant amount of jitter, which usually is not tolerated by the downstream consumer circuitry. A jitter attenuating phase locked loop (PLL) is typically used to create an output signal that has the same average frequency as the gapped signal with the jitter component attenuated. When the jitter component is interspersed in the gapped signal at a relatively high frequency, it can be effectively attenuated by the PLL. In addition, jitter with short durations can be removed more easily than those with long periods.

Jitter attenuation issues are compounded with the bandwidth limits of PLLs used in frequency synthesizers, especially for incoming signals carrying stuffed bytes, such as those introduced during justification processes. Asynchronous mapping of Constant Bit Rate (CBR) clients, such as SONET or SDH, typically adapts the bit rates of SONET/SDH to the asynchronous OTUk (k=1, 2, 3) bit rate for transportation using byte stuffing, or justification, mechanism in order to increase bit-rate tolerance. If the client signal rate is lower than an OTUk rate after adjustment due to stuffing/overhead, extra stuff bytes are inserted to fill out the OTUk frame. Similarly, if the client signal rate is higher than OTUk after adjustment due to stuffing/overhead, the stuff bytes can be replaced with client information to increase the OTUk payload capacity.

A justification process adds control (JC) bytes to a data frame to control the negative justification opportunity (NJO) or positive justification opportunity (PJO). Introduction of the JC bytes, along with justification control bits indicating the addition of the JC bytes causes a shift of data transmission rate. During a corresponding demapping process, the JC bytes and JC control bites, or the stuffing information, are interpreted and incorporated while reconstructing the CBR client signal clock. A phase locked loop (PLL) is typically used for the frequency synthesis. Ideally, the data signal is read out under control of a smooth clock.

The extra bytes or gaps introduced by such a justification process can cause large phase steps, or jitter, of low frequency in demapping process. Conventional jitter attenuation methods and systems utilizing a PLL have limited bandwidth for jitter attenuation. For example, a bandwidth of 300 Hz is specified in ITU-T G.8251 for demapping. It has been observed that conventional jitter attenuation PLLs are inefficient in removing jitter caused by the justification processes.

SUMMARY OF THE INVENTION

Therefore, it would also be advantageous to provide a mechanism to generate gapped clocks with reduced jitter without introducing complicated circuitry, particularly with jitter component characteristic of short durations and evenly interspersed. It would also be advantageous to provide a mechanism to expand the capability of a phase locked loop (PLL) of attenuating low frequency jitter, such as jitter caused by justification bytes, without introducing complicated circuitry.

Accordingly, embodiments of the present disclosure employ a Delta Sigma Modulator (DSM) to generate a gapping control signal to control a pulse removal rate and a pulse removal resolution of a gapper based on a targeted gapping ratio of the gapper. Stuffing information can be combined with the gapping control signal to additionally adjust the gapped signal in accordance with the phase/frequency shift caused by a corresponding justification process. The gap removal rate as well as a gap removal resolution of the gapper can be varied by appropriate configurations of the DSM.

Moreover, embodiments of the present disclosure employ a smoothing logic coupled with a PLL to modify a phase error signal generated by a phase frequency detector into a distributed phase error signal that spread over multiple clock cycles. Thereby, jitter associated with the phase error signal can be converted to a sequence of small jitter with fractional durations and advantageously attenuated efficiently by the PLL.

In one embodiment of the present disclosure, a method of jitter attenuation comprises providing an input signal to a PLL; detecting a phase difference between the input signal and the feedback signal of the PLL and generating a first phase error signal; and converting the first phase error signal into a second phase error signal comprising a small average gradient than the first phase error signal. In some embodiments, the second phase error signal may comprise a ramping signal.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which:

FIG. 4A are signal timing diagrams depicting the waveforms in a frequency synthesizer effected by a phase step without smoothing.

FIG. 4B are signal timing diagrams depicting the waveforms in a frequency synthesizer where a large phase step is smoothed into multiple smaller phase steps in accordance with an embodiment of the present disclosure.

DETAILED DESCRIPTION

Figure 1:
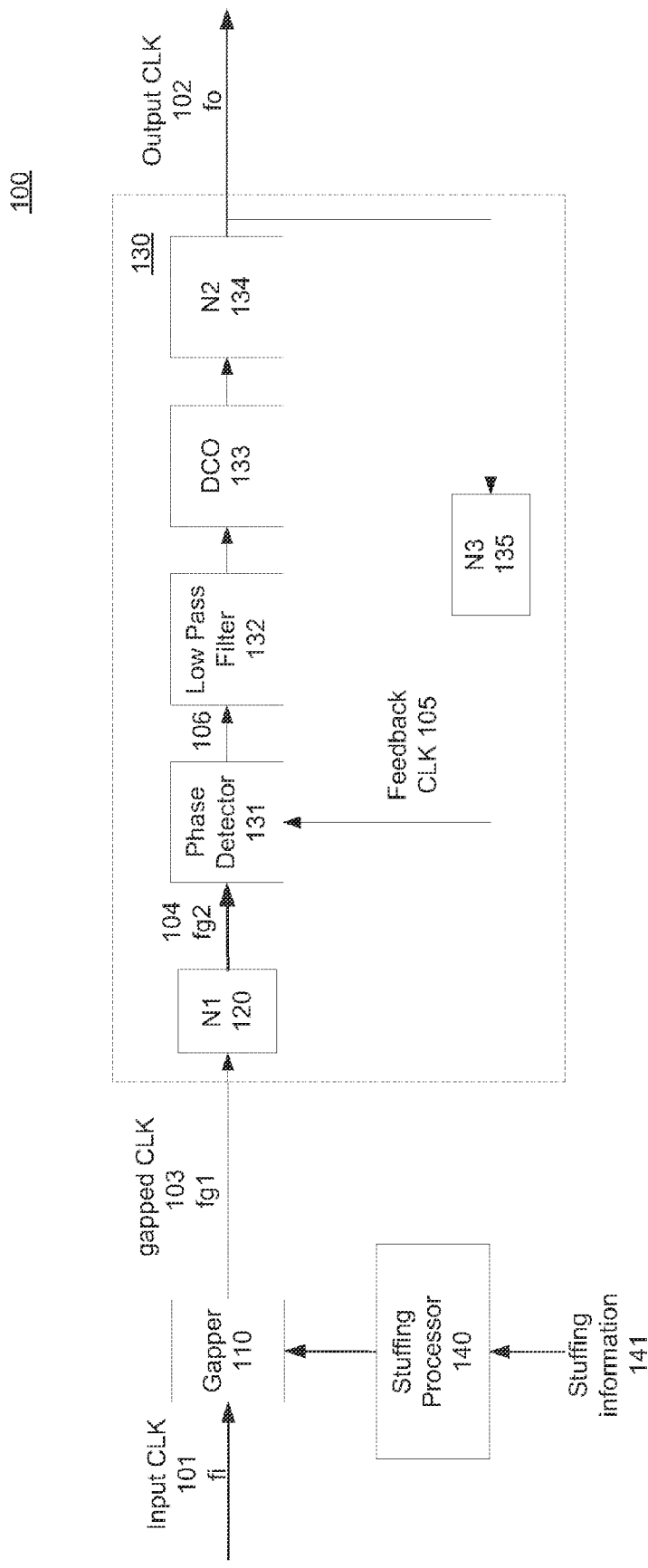
FIG. 1 illustrates an exemplary configuration of a frequency synthesizer 100 that employs a gapper 110 coupled with a PLL 130 and has the capability of generating an output signal with attenuated jitter and intended frequency based on an input signal 101 and related stuffing information 141 in accordance with an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Method and Apparatus for Smoothing Jitter Generated by Byte Stuffing

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

FIG. 1 illustrates an exemplary configuration of a frequency synthesizer 100 that employs a gapper 110 coupled with a PLL 130 and has the capability of generating an output signal with attenuated jitter and intended frequency based on an input signal 101 and related stuffing information 141 in accordance with an embodiment of the present disclosure. Provided with an input CLK 101 with a frequency of $f_i$ and the stuffing information, the frequency synthesizer 100 is capable of producing an output clock 102 with a desired frequency ratio R, i.e. $f_o = f_i \cdot R$. The stuffing information 141 may correspond to the justification bytes included in a data frame which cause phase and frequency shift of the input signal.

The gapper 110 can generates a first gapped signal 103 with a frequency of $f_{g1} = f_i/G$, where G represents a gapping ratio of the gapper and usually is a rational number expressed by a ratio of two integers, P/Q. In addition, the stuffing information is processed in the stuffing processor 140 and provided to the gapper 110 to be incorporated into the first gapped CLK 103. The stuffing information 141 may represent the negative justification opportunity (NJO) bytes, positive justification opportunity (OJO) bytes, and associated justification control in an input signal. In operation, responsive to the stuffing information, the gapper adds or removes an extra gap in addition to the gap removal demanded by the G ratio. As a result, the phase and frequency shifts introduced by the justification process are reflected in the first gapped CLK 103 and eventually in the output CLK 102.

The first gapped CLK 103 is provided to the PLL 130 for jitter attenuation and frequency multiplication. The PLL 130 includes an integer divider N2 120, a phase detector 131 coupled with a loop filter 132, a digital-controlled oscillator (DCO) 133 coupled with the loop filter 132, an integer divider N2 134 coupled with the DCO 133 and an integer divider 135 disposed in the feedback loop. In some embodiments, the DCO 133 can be substituted with a voltage-controlled oscillator (VCO). The configuration may yield a ratio $$R = \frac{N3}{G \cdot N1}$$

for the frequency synthesizer 100.

In the PLL 130, the phase frequency detector 131, or phase detector, can compare the frequency phase difference between the second gapped CLK 104 and the feedback CLK 105 and generate an error signal 106 accordingly. The error signal 106 can be forwarded to the DCO 133 through a low pass filter 132 and drives the DCO to generate an oscillated signal with adjusted frequency. The second integer divider 134 divides the oscillated signal with a divide ratio of N2 and generates the output CLK 102. The output CLK 102 is then divided by N3 and converted to the feedback CLK 105. Thereby, at the output of the PLL 130, the output CLK 102 is produced with significantly reduced jitters and a desired output frequency $f_o$.

Figure 2:
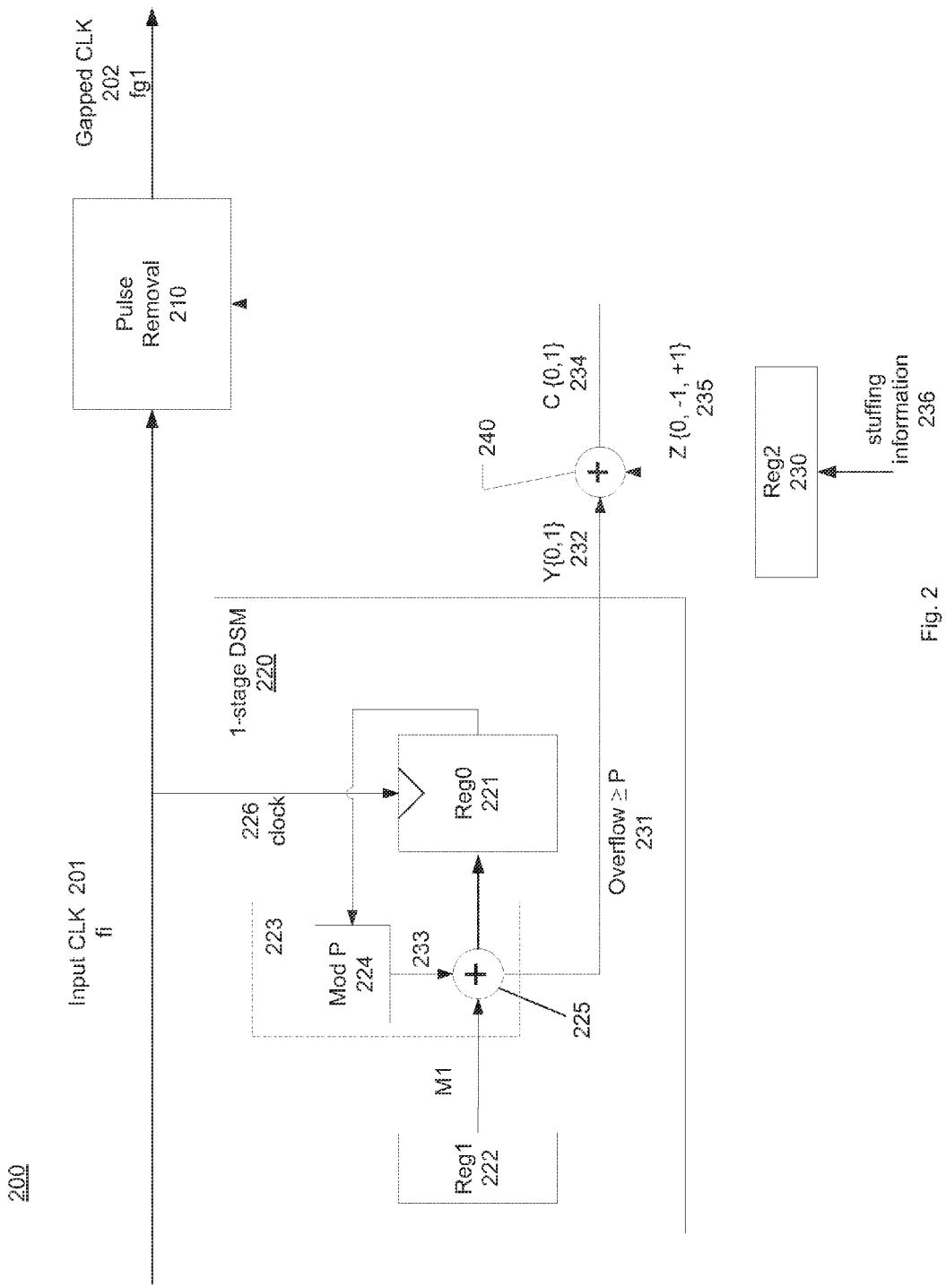
FIG. 2 illustrates an exemplary configuration of a gapper 200 operable to generate a gapped signal, or a gapped clock, with relatively evenly spread jitter according to an intended frequency ratio (G=P/Q) and stuffing information 236 in accordance with an embodiment of the present disclosure.

Because evenly spread jitter can be attenuated by a PLL relatively efficiently, it is beneficial that gaps present in short durations and are interspersed evenly in a gapped signal. FIG. 2 illustrates an exemplary configuration of a gapper 200 operable to generate a gapped signal, or a gapped clock, with relatively evenly spread jitter according to an intended frequency ratio (G=P/Q) and stuffing information 236 in accordance with an embodiment of the present disclosure. The gapper 200 comprises a pulse removal module 210, a Delta Sigma Modulator (DSM) 220, a register Reg2 230, and an adder 240.

The gapper 200 is configured to receive the input CLK 201 with a frequency $f_i$, and output a gapped CLK 202 with an average frequency equivalent to $f_{g1}$ in accordance with a gapping control signal C 234. The gapper 200 can be used in frequency synthesizers, such as the one illustrated in FIG. 1. In some embodiments, the input CLK 201 may be a reference clock or a smooth clock.

According to the illustrated embodiment, the gapping control signal C 234 is a combination of two components, Y 232 and Z 235. Y 232 is generated by the DSM 220 based on the desired G ratio which may be derived from the desired frequency ratio R of the associated frequency synthesizer. Z can be derived from the stuffing information of an input signal.

The DSM 220 comprises a clock input 226 configured to receive a clock signal, a first register Reg0 221 used for storing a Reg0 value, a second register Reg1 222 used for storing a preset number M1, a modulo component 223, an adding component 225 coupled with Reg0 221 and Reg1 222. In the illustrated embodiment, the input CLK 201 serves as the clock signal supplied to Reg0 221. In some other embodiments, other suitable signals can be used as clock signal for Reg0 221. In some embodiments, the modulo component 224 is integrated with the adding component 225 in the adder/subtractor 223.

In the illustrated embodiments, the pulse removal resolution of the gapper 200 is advantageously adjustable with the M1 value. In some embodiments, M1 is set to K(P−Q), where K is a positive integer, e.g. 1, 2, 3, . . . . In response to a control signal Y 232, the gapping circuit can remove a 1/K portion of a pulse. For example, when K is equal to 1, the gapper can remove a full pulse from the input CLK 201. When K is equal to 2, the gapper is capable of removing a half pulse. However, in some embodiments, regardless of the different resolution adopted, the gapper can remove an equivalent of Q pulses from a window of P pulses in the input CLK, and thus has a frequency ratio of P/Q.

According to the illustrated embodiment, during a clock cycle, the adder 225 performs adding (P−Q) with Reg0 and provides the result to the modulo component 224 to perform modulo P. The remainder of MOD(((M1+Reg0), M2) 233 is then provided to update Reg0 221. In an alternative embodiment, during a clock cycle, the modulo component 224 can read the stored value in Reg0 221 and perform Reg0 modulo $P$. The remainder 233 of the modulo operation is added with M1 in the adding component 225, the result of which is supplied to Reg0 221 to update the value stored therein. That is, Reg0=K(P−Q)+MOD(Reg0, Q).

Whenever an overflow occurs as a result of the above operations in a certain cycle, the overflow value can be compared with P. If the overflow value is greater than or equal to P, Y 234 is set to a value indicating the pulse removal module 210 to remove a 1/K portion of a pulse.

The register Reg2 230 stores control signal Z 235 representing byte stuffing information of an input signal. In some embodiments, the control signal Z 235 can be generated by a stuffing processor, as 141 in FIG. 1. Y 234 is combined with Z 235 to generate C 234. If C=1, a 1/K portion of a pulse is removed by the pulse removal module 210.

Figure 3:
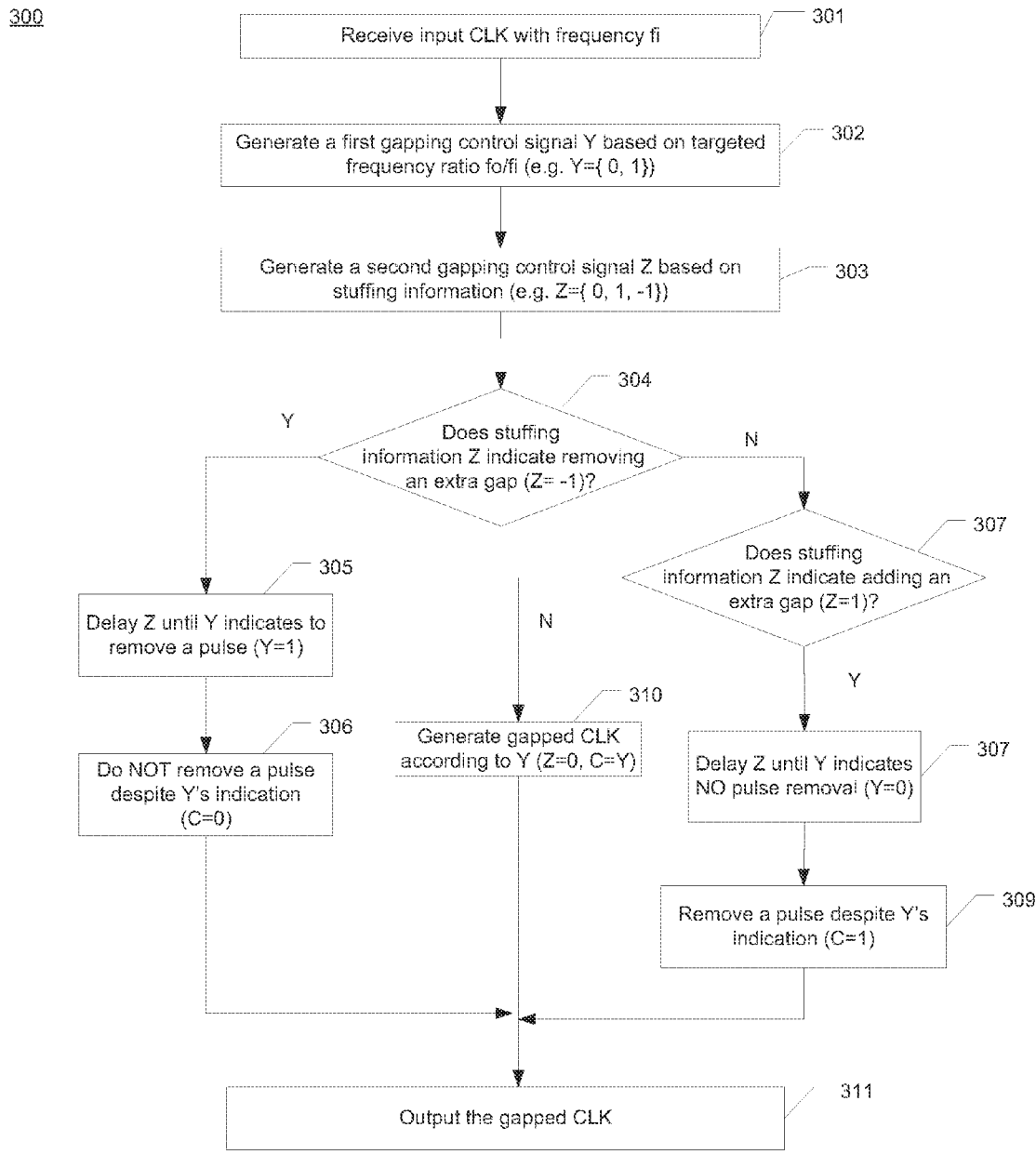
FIG. 3 is a flow diagram depicting an exemplary method 300 of generating a gapped signal in response to a control signal C by employing a gapper comprising a DSM in accordance with an embodiment of the present disclosure.

FIG. 3 is a flow diagram depicting an exemplary method 300 of generating a gapped signal in response to a control signal C by employing a gapper comprising a DSM in accordance with an embodiment of the present disclosure. The gapper may have a similar configuration as shown in FIG. 2.

At 301, the input CLK with a frequency $f_i$ is received. At 302, a first gapping control signal Y is generated based on targeted frequency ratio G of the gapper which may be derived from a frequency ratio R of an associated frequency synthesizer. According to this embodiment, Y can be 0 or 1, where Y=1 indicates a pulse removal operation being performed on the input CLK.

To implement, in some embodiments, Reg0 can be initialized to 0 and Reg1 is initialized to (P−Q) at 302. Reg0 can be incremented by the input CLK. During each clock cycle of the clock signal, Reg0 can be updated with a new value:

$$\text{MOD}\left(\frac{Reg0}{P}\right) + (P-Q).$$

In some other embodiments, Reg0 is updated with MOD (((P−Q)+Reg0), P). If the overflow is detected and greater than P during a certain clock cycle, Y is set to 1 indicating a full pulse (K=1) is removed from the input CLK in this clock cycle. Otherwise, Y is set to 0.

At 303, a second gapping control signal Z is generated based on the stuffing information. In some embodiments, Z can be generated from a stuffing processor and set to 0, 1, or −1. For example, Z=−1 represents removing an extra gap due to a NJO byte; Z=1 which represents adding an extra gap due to a PJO byte; and otherwise Z=0.

In this embodiment, C=Y+Z and can only be 0 or 1. Thus, if an invalid C would be resulted from the addition, the stuffing processor output Z is delayed until Z is suitable to be applied on Y. At 304, if it is determined that Z indicates removing an extra gap from the input CLK (Z=−1), Z is delayed until Y=1 at 405, i.e. until Y indicates a pulse removal to be performed at the pulse removal module. When it comes that Y=1 at 306, C becomes 0 and therefore no pulse removal is performed at the pulse removal module contrary to Y's indication. At 311, the pulse removal module outputs the gapped CLK.

Similarly, if it is determined that Z indicates adding an extra gap from the input CLK (Z=1) at 407, Z is delayed until Y=0 at 308, i.e. until Y indicates no pulse removal to be performed. When Y becomes 0 at 309, C becomes 1 and therefore a pulse removal is performed at the pulse removal module despite Y's indication. At 311, the pulse removal module outputs the gapped CLK.

If Z is equal to 0 as determined at 307, it can be applied on Y=0 or 1, and thus the pulse removal module is solely controlled by Y. At 311, the pulse removal module outputs the gapped CLK.

In order to further reduce jitter when producing the gapped CLK, in some embodiments, the gapper can be configured to avoid multiple pulse removal operations in consecutive clocks. For example, any pulse removal may be postponed until there is an opportunity where previous clock has no pulse removal. In some embodiments, consecutive pulse removals are limited to no more than a predetermined number of clock cycles.

Because jitter caused by byte stuffing is usually manifested as phase jumps, or phase steps, of large amplitudes in a gapped signal, the jitter can be attenuated if such a phase jump is converted to multiple smaller phase steps distributed in multiple clock cycles, as illustrated in FIG. 4A and FIG. 4B. In some embodiments, a phase jump as detected by a phase detector in a PLL can be replaced by a smoothed phase error signal which is provided to the DCO.

FIG. 4A are signal timing diagrams depicting the waveforms in a frequency synthesizer affected by a phase step without smoothing. The frequency synthesizer may have a similar configuration as illustrated in FIGS. 1 and 2. The phase step may correspond to byte stuffing. The waveform 401 represents a sequence of a smooth input CLK without jitter. The waveform 402 shows a gapped signal with a gap introduced in the second clock cycle 404, e.g. according to a NJO byte stuffing. The gap is detected by the phase frequency detector as a phase difference between the gapped clock provided to the PLL and the feedback signal of the PLL, as shown in 403. The gap is equivalent to a delayed time offset D and translated to a phase step of −k• D, wherein k is a coefficient representing the phase frequency detector gain. As discussed above, such a phase step may not be efficiently attenuated by a PLL or tolerated by downstream circuits due to its large amplitude In contrast, FIG. 4B are signal timing diagrams depicting the waveforms in a frequency synthesizer where a large phase step is smoothed into multiple smaller phase steps in accordance with an embodiment of the present disclosure. The waveform 411 corresponds to a sequence of a smooth input CLK without jitter. The waveform 413 shows that, instead of outputting a phase step with amplitude of −k• D to drive the DCO, a series of ramped steps 433 with a total amplitude of −k• D is output in response to a detection of a full missing pulse at the second clock cycle. The ramped steps span five consecutive clock cycles (between dashed lines 431 and 432) with each step decrementing by −k• D/5. In effect, the output waveform 412 encompasses five pulses between dashed lines 431 and 432, each with a time delay of D/5, which is equivalent to a full missing gap causing a time delay of D. As shown, the input CLK 411 has six pulses while the smoothed CLK has five pulses. In this manner, jitter caused by byte stuffing can be significantly attenuated.

Similarly, a phase jump caused by a PJO presents as a positive step in the phase error signal. In accordance with the present disclosure, the positive step of large amplitude can be replaced with multiple small steps with each step incrementing by a positive value.

The disclosure is not limited to any particular number of clock cycles that a phase step can be distributed to. In some embodiments, the number of clocks cycles to distribute a phase ramp can be determined based on an amplitude of a corresponding phase jump. In some embodiments, the phase ramp can be extended up to an arrival time of a succeeding phase step. In still some other embodiments, a phase step may be distributed to inconsecutive clock cycles.

In some other embodiments, a phase step can be converted into any other suitable waveforms to be provided to the DCO as a corrected phase error signal.

Figure 5:
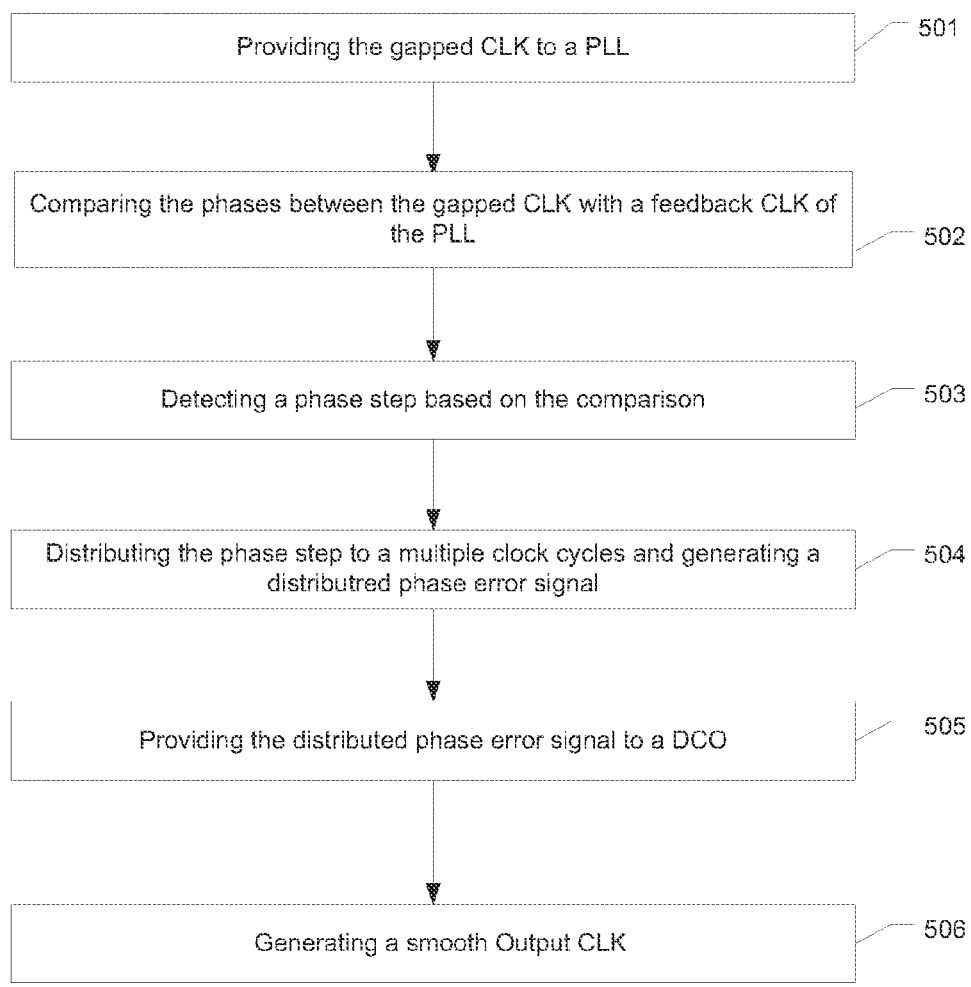
FIG. 5 is a flow chart depicting an exemplary method 500 of enhancing jitter attenuating capability of a PLL by smoothing out a phase step in accordance with an embodiment of the present disclosure.

FIG. 5 is a flow chart depicting an exemplary method 500 of enhancing jitter attenuating capability of a PLL by smoothing out a phase step in accordance with an embodiment of the present disclosure. At 501, a gapped CLK is input to the PLL. At 502, a phase detector can then compare the phases between the gapped CLK with the feedback signal derived from the DCO. When a phase error is detected at 503 in the phase error signal at a certain clock cycle, the phase error is distributed to a multiple clock cycle and thereby a distributed phase error signal with a decreased average gradient is generated at 504. The distributed phase error signal is then provided to the DCO at 505 to generate a smoothed output CLK with attenuated jitter at 506.

Figure 6:
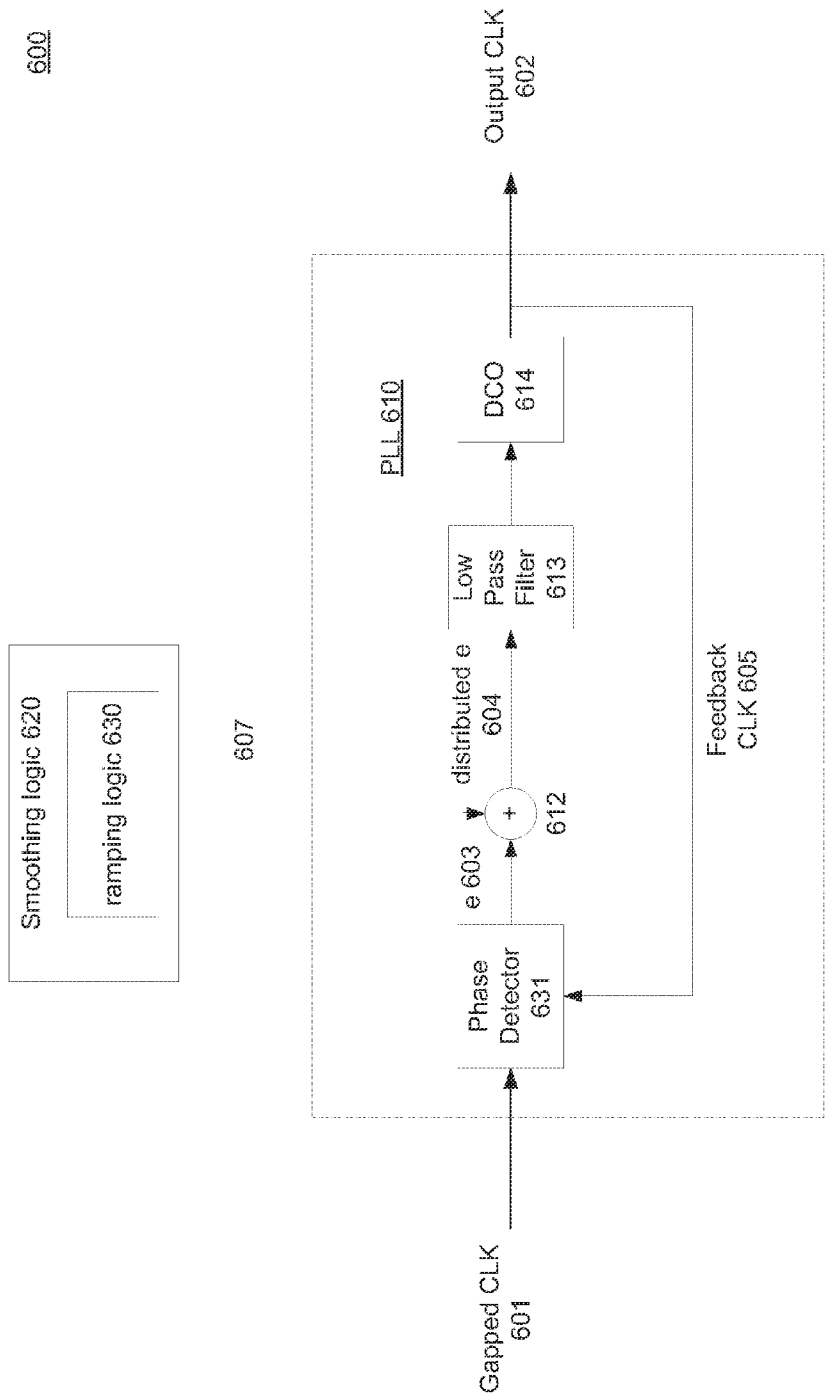
FIG. 6 illustrates an exemplary configuration of PLL 610 coupled with a smoothing logic 620 that implements a jitter attenuating method in accordance with an embodiment of the present disclosure.

FIG. 6 illustrates an exemplary configuration of PLL 610 coupled with a smoothing logic 620 that implements a jitter attenuating method in accordance with an embodiment of the present disclosure. The PLL comprises a phase detector 611, an adder/subtractor 612, a low pass filter 613 and a DCO 614. The smoothing logic comprises a ramping logic that can generate ramping values 607 for ramped steps. The smoothing logic 620 can provide the ramping values to the PLL 610 at the right timings. In response to a phase step detected in the phase error signal 603, the adder/subtractor 612 can add the ramping values 607 to the phase error signal 603 generated by the phase detector 611 and output a ramped phase error signal 604. The ramped phase error signal 604 can be forwarded to the DCO 133 through the low pass filter 613. In some other embodiments, a PLL coupled with a smoothing logic may comprise other components such as integer dividers as shown in FIG. 1.

Although the mechanism is particularly useful to attenuate jitter from gapped signals generated by byte stuffing, its applications are not limited to reconstructing byte-stuffed signals. The mechanism in accordance with the present disclosure may be used in any suitable application environment utilizing a phase detector or a PLL, including frequency synthesis, clock recovery, deskewing, clock generation, spread spectrum, clock distribution, and noise spur reduction.

Figure 7:
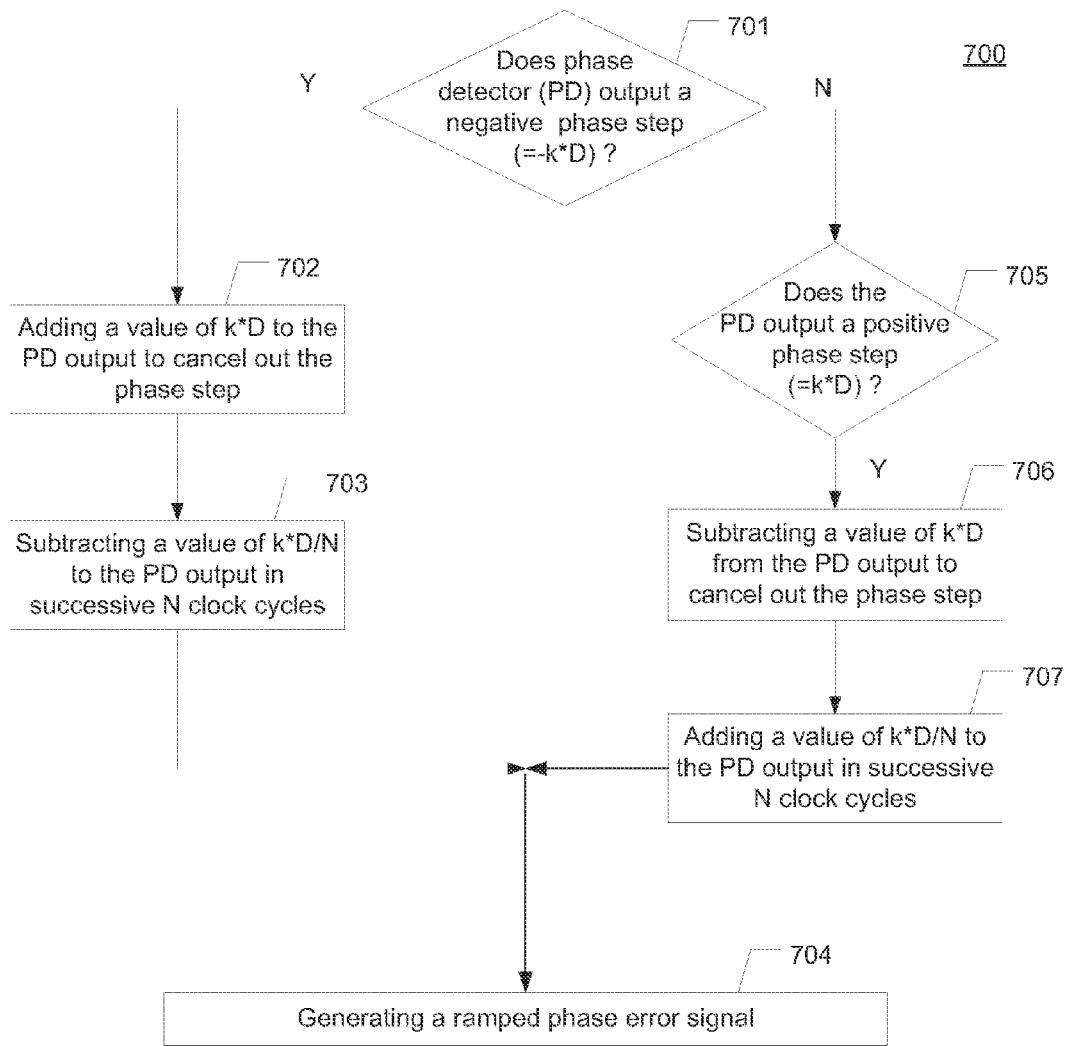
FIG. 7 is a flow chart depicting a method 700 of generating a ramped phase error signal in response to a phase step detected by a phase detector in a PLL.

FIG. 7 is a flow chart depicting a method 700 of generating a ramped phase error signal in response to a phase step detected by a phase detector in a PLL. If it is determined that the phase detector outputs a phase error of −k• D during a clock cycle at 701, e.g. a phase jump caused by a NJO byte, an initial value of k• D can be added to the phase detector output to cancel out the phase error at 702. At 703, a step value of k• D/N is subtracted from phase error signal in each of the subsequent N clock cycles to generate a ramped phase error signal at 704. Thus the ramped phase error signal is decremented by the step value in each clock cycle and consequently by −k• D in total over the N clock cycles.

Similarly, if the positive phase error of k• D during a clock cycle at 701, e.g. a phase jump caused by a PJO byte, an initial value of −k• D can be added to the phase detector output to cancel out the phase error at 705. At 706, a step value of −k•D/N is subtracted from phase error signal in each of the subsequent N clock cycles to generate a ramped phase error signal. Thus a ramped phase error signal that increments by a step value for the N clock cycles is generate at 704.

In some embodiments, the ramped phase error signal may increment or decrement by different step values in each clock cycle.

Figure 8:
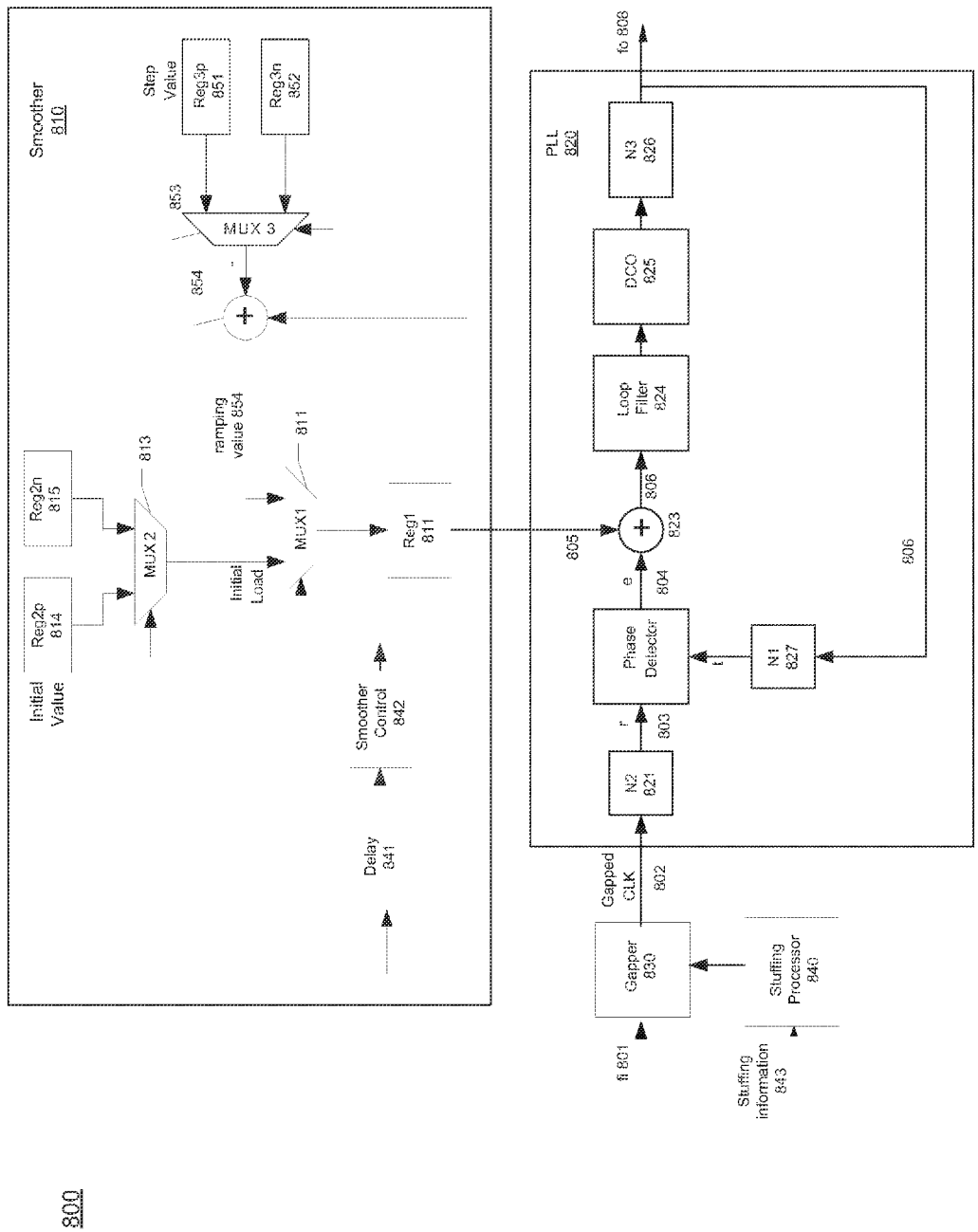
FIG. 8 illustrates an exemplary configuration of a frequency synthesizer 800 that employs smoothing logic 810 coupled to the phase detector 822 through an adder/subtractor 823 in the PLL 820 in accordance with an embodiment of the present disclosure

FIG. 8 illustrates an exemplary configuration of a frequency synthesizer 800 that employs smoothing logic 810 coupled to the phase detector 822 through an adder/subtractor 823 in the PLL 820 in accordance with an embodiment of the present disclosure. The frequency synthesizer 800 also includes a gapper 830 coupled with a stuffing processor 840 to generate a first gapped signal 802 based on an input signal 801.

The smoothing logic 810 comprises a control logic 842 coupled to a delay logic 841, and a ramping logic 850. The ramping logic 850 includes registers Reg2p 814 and Reg2n 815, register Reg1 811, and an adder/subtractor 854 coupled to registers Reg3p 851 and Reg3n 852 via a multiplexer MUX3 854.

The ramping logic 850 can generate a sequence of ramping values to replace a phase error, or a phase step. The registers Reg2p 814 and Reg2n 815 can store initial value of a positive phase step and negative phase step, respectively. The registers Reg3p 851 and Reg3n 852 can store the step value of a positive and negative phase error, respectively. In some embodiments, the step value stored in Reg3p 851 and Reg3n 852 can be equal to the initial value divided by N, where N is the number of clocks that the phase error is set to spread over.

During operation, when the phase detector 822 detects a phase error k•D, e.g. corresponding to an extra gap added in the gapped CLK due to byte stuffing, the control logic 842 can first load the initial value from the Reg2p 814 into Reg1 811. The adder 823 can instantaneously add the initial value from Reg1 811 with the phase error signal 804 to cancel out the phase error. In some embodiments, the output 804 of the phase detector 822 is a digital signal, and therefore, the value stored at Reg2p 814 is added digitally to the phase error signal 804. Then, for each of the subsequent clock cycle 804, a step value stored at the Reg3p 851 is subtracted from Reg1 811 until Reg1 has a zero value. Thus, Reg1 811 is updated with the new ramping values 805 which are added to the phase error signal 804 to generate a ramped phase error signal 806.

Likewise, when a gap is eliminated from the gapped CLK in response to the stuffing information, it is equivalent to subtracting a time offset D from the gapped CLK 802 of the PLL 820. The phase detector 822 detects the time offset and thereby the phase error signal 804 is higher by a value of k•D. The smoothing logic can subtract from the phase error signal a value of k•D, which cancels out the byte stuffing effect. The register Reg2n 815 has an initial value of −k•D which can be loaded into Reg1 as instructed by the control logic 842. Then, for each of the subsequent clock cycle 804, a step value stored at the Reg3n 852 is added to Reg1 811 until Reg1 has a zero value.

In some embodiments, the occurrence frequency of phase errors in a data frame can be predictable and can be used to determined N. For example, the stuffing information may arrive at a fixed rate in every M clock cycles. In such cases, N can be set to M, so each phase error step due to stuffing is converted to a phase ramp with a slow gradient that terminates just before the next stuffing arrives. Therefore, the jitter generated by stuffing can be smoothed out and the output signal of the PLL may include little jitter component.

Figure 9:
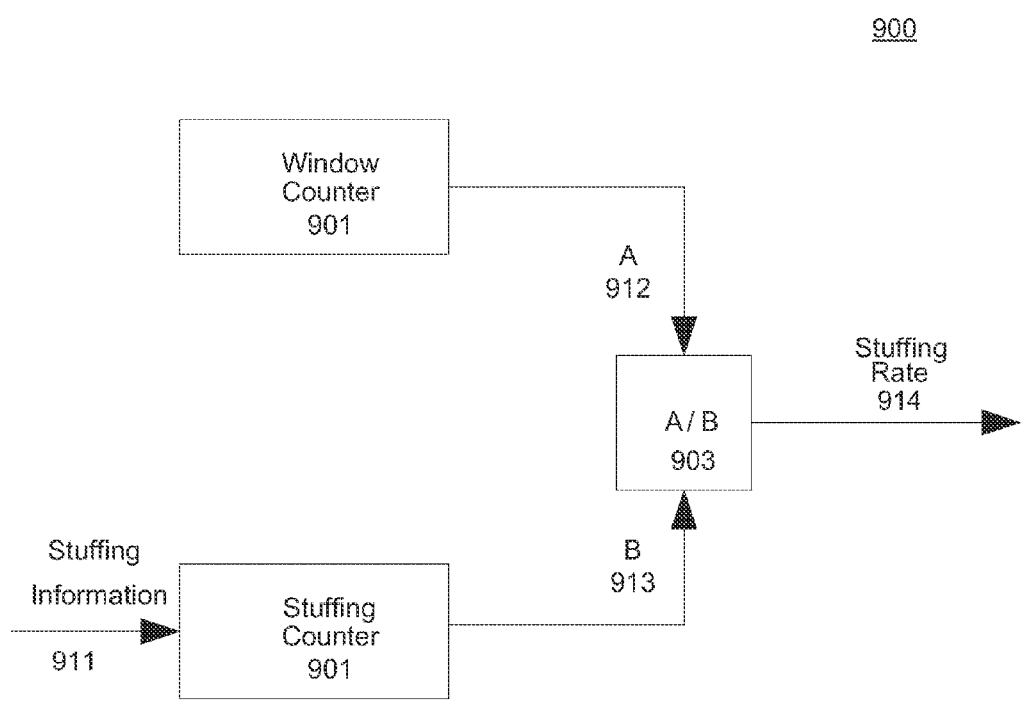
FIG. 9 is an exemplary configuration of a circuit 900 capable of estimating a phase error occurrence frequency.

FIG. 9 is an exemplary configuration of a circuit 900 capable of estimating a phase error occurrence frequency. The circuit 900 comprises a stuffing counter 901, a window counter 902, and a divider 903. The window counter can count and output the number of clock cycles, while the stuffing counter can count and output the stuffing occurrences with such number of clock cycles base on the stuffing information 911. The number of clock cycles A and the stuffing occurrences are fed to the divider 903 to calculate the stuffing rate 914. The stuffing rate 914 is then utilized to derive a N for phase ramping. To practice the present disclosure, any other suitable device or method can be used to calculate a number N.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method of jitter attenuation, said method comprising:
   providing an input signal to a phase lock loop (PLL);
   detecting a phase difference between said input signal and a feedback signal of said PLL and generating a first phase error signal; and
   converting said first phase error signal to a second phase error signal comprising a smaller average gradient than said first phase error signal, wherein:
   said converting said first phase error signal comprises generating a sequence of ramping values and adding each of said sequence of ramping values to said first phase error signal for a plurality of clock cycles; and an initial value of said sequence of ramping values is equal to an additive inverse of said phase difference.

2. The method of claim 1, wherein said generating a sequence of ramping values comprises:
   dividing said first phase difference by N to generate a step value, where N is a positive integer; and
   during a respective clock cycle of said plurality of clock cycles, subtracting said step value from a preceding ramping value to generate a respective ramping value.

3. The method of claim 2 further comprising determining N based on an estimated occurrence frequency of detectable phase differences.

4. The method of claim 1 further comprising providing said second phase error signal to a loop filter coupled with a digital controlled oscillator (DCO), and generating an output signal of said PLL, wherein said output signal comprise less jitter than said input signal.

5. The method of claim 1 further comprising generating said input signal by removing pulses from a stream of pulses.

6. The method of claim 5 further comprising incorporating stuffing information while removing pulses from said stream of pulses, wherein said phase difference corresponds to a negative justification opportunity or a positive justification opportunity indicated by said stuffing information.

7. An integrated circuit for frequency synthesis, said integrated circuit comprising:
   a phase locked loop (PLL) comprising a phase frequency detector configured to output a phase error signal based on comparison between an input signal and a feedback signal of said PLL; and
   smoothing logic coupled to said phase frequency detector and configured to distribute a phase step in said phase error signal to a plurality of clock cycles, wherein: said smoothing logic comprises ramping logic configured to generate a plurality of ramping values during said plurality of clock cycles; said plurality of ramping values have amplitudes smaller than an amplitude of said phase step; said plurality of ramping values comprise an initial value that is equal to an additive inverse of said phase step; and said ramping logic comprises a first adder/subtractor configured to subtract a step value from a preceding ramping value during a respective clock cycle of said plurality of clock cycles and output a respective ramping value of said plurality of ramping values; and a register to store said initial value.

8. The integrated circuit of claim 7 further comprising a second adder/subtractor coupled to said phase detector and said smoothing logic, said second adder/subtractor operable to:
  add said plurality of ramping values to said phase error signal during said plurality of clock cycles; and
  output a ramped phase error signal.

9. The integrated circuit of claim 8, wherein said PLL further comprises a loop filter coupled to said second adder/subtractor and configured to receive said ramped phase error signal, and a digital controlled oscillator (DCO) coupled to said loop filter.

10. The integrated circuit of claim 8, wherein said plurality of clock cycles comprise N consecutive clock cycles, wherein said step value is substantially equal to said initial value divided by said N.

11. The integrated circuit of claim 8 further comprising rate estimation logic configured to derive said N in accordance with an estimation on an occurrence frequency of phase steps in said phase error signal, wherein said rate estimation logic comprises a divider coupled with a window counter, and a stuffing/gap counter.

12. The integrated circuit of claim 8, further comprising, a gapper coupled with said PLL, wherein said input signal comprises a gapped clock generated by said gapper wherein said gapped clock generated by said gapper is generated responsive to stuffing information.

13. The integrated circuit of claim 12 further comprising a stuffing processor coupled with said gapper, wherein said stuffing processor is operable to process stuffing information, wherein said input signal comprises a byte-stuffed clock, wherein said smoothing logic further comprises control logic coupled to said stuffing processor and operable to control an input to said second adder/subtractor in accordance with stuffing information.

14. The integrated circuit of claim 7, further comprising, a gapper coupled with said PLL, wherein said input signal comprises a gapped clock generated by said gapper wherein said PLL further comprises: a first integer divider coupled between said gapper and said phase frequency detector; a second integer divider coupled between a DCO and an output of said PLL, and a third integer divider disposed in the feedback loop of said PLL.

15. A method of frequency synthesis, said method comprising:
  providing a gapped signal to a phase locked loop (PLL);
  detecting a phase difference between said gapped signal with a feedback signal of said PLL to generate a first phase error signal;
  converting said first phase error signal to a second phase error signal having a smaller average gradient than said first phase error signal; and
  generating an output signal of said PLL responsive to said second phase error signal, said output signal having said output frequency;
  removing pulses from an input signal having an input frequency in accordance with a predetermined ratio of said input frequency to an output frequency; and
  incorporating stuffing information when removing pulses from said input signal, wherein said phase difference corresponds to a phase shift caused by said stuffing information.

16. The method of claim 15 further comprising multiplying said gapped signal with a rational number.

17. The method of claim 15, wherein converting said first phase error signal comprises ramping said phase difference to a plurality of clock cycles and before a next phase difference is detected.

* * * * *